US008693706B2

(12) United States Patent
Yokoyama

(10) Patent No.: US 8,693,706 B2
(45) Date of Patent: Apr. 8, 2014

(54) PSEUDO BASS GENERATING APPARATUS

(75) Inventor: Yasutomo Yokoyama, Kyoto (JP)

(73) Assignee: Rohm Co., Ltd. (JP)

( * ) Notice: Subject to any disclaimer, the term of this patent is extended or adjusted under 35 U.S.C. 154(b) by 73 days.

(21) Appl. No.: 13/545,135

(22) Filed: Jul. 10, 2012

(65) Prior Publication Data

US 2013/0177171 A1 Jul. 11, 2013

(30) Foreign Application Priority Data

Jul. 11, 2011 (JP) ................................ 2011-152902

(51) Int. Cl.
*H03G 5/00* (2006.01)
*H04R 5/00* (2006.01)

(52) U.S. Cl.
USPC ................................................ 381/98; 381/1

(58) Field of Classification Search
USPC ............. 381/94.1, 61, 58, 98, 1; 84/622, 625
See application file for complete search history.

(56) References Cited

U.S. PATENT DOCUMENTS 8,150,067 B2 * 4/2012 Ohkuri et al. .................. 381/98
2010/0086147 A1 * 4/2010 Hung ............................ 381/98
2010/0215192 A1 * 8/2010 Minnaar ....................... 381/98

FOREIGN PATENT DOCUMENTS

JP 2011-82960 A 4/2011

* cited by examiner

*Primary Examiner* — Vivian Chin
*Assistant Examiner* — Ammar Hamid
(74) *Attorney, Agent, or Firm* — Cantor Colburn LLP

(57) ABSTRACT

A pseudo bass generating apparatus includes a first $4^{th}$-order LPF, an absolute value circuit, a clip circuit, a multiplier, a first adder for subtracting an output signal of the multiplier from an output signal of the clip circuit, a second adder for adding an output signal of the first adder and an output signal of the absolute value circuit, a second $4^{th}$-order LPF, and a third adder for adding the input signal and an output signal of the second $4^{th}$-order LPF.

12 Claims, 5 Drawing Sheets

PSEUDO BASS GENERATING APPARATUS

CROSS-REFERENCE TO RELATED APPLICATION

This application is based upon and claims the benefit of priority from Japanese Patent Application No. 2011-152902, filed on Jul. 11, 2011, the entire contents of which are incorporated herein by reference.

TECHNICAL FIELD

The present disclosure relates to processing audio signals, in particular, a pseudo bass generating apparatus for generating a pseudo bass.

BACKGROUND

A pseudo bass is used as a method of generating a bass lower than a band of a speaker or a headphone (hereinafter, collectively referred to as a speaker). When f1 is a frequency of the bass desired to reproduce, if a frequency f2 (double the frequency f1) and a frequency f3 (three times the frequency f1) are input to the speaker, a frequency difference (f3−f2) (in other words the original frequency f1) can be perceived by a user (listener).

For example, if signals of two frequencies whose greatest common divisor is 50 Hz (for example, a 100 Hz signal as a $2^{nd}$-order harmonic and a 150 Hz signal as a $3^{rd}$-order harmonic) are input to a speaker which is not able to reproduce a band of 50 Hz or less, the listener perceives the output as if a 50 Hz sound is being reproduced.

In the related art, for example, a reproduced sound under such conditions contains noise, which is still insufficient to generate a high-quality pseudo bass.

SUMMARY

The present disclosure describes various embodiments of a pseudo bass generating apparatus to generate a high-quality pseudo bass with minimal or reduced noise.

According to some embodiments, there is provided a pseudo bass generating apparatus which includes a first $4^{th}$-order low pass filter configured to cut high frequency components having a frequency higher than a first predetermined cutoff frequency from an input signal, an absolute value circuit configured to output an absolute value of an output signal of the first $4^{th}$-order low pass filter, a clip circuit configured to clip the output signal of the first $4^{th}$-order low pass filter with predetermined positive and negative limit values, a multiplier configured to multiply the output signal of the first $4^{th}$-order low pass filter with a predetermined coefficient, a first adder configured to subtract an output signal of the multiplier from an output signal of the clip circuit, a second adder configured to add an output signal of the first adder and an output signal of the absolute value circuit, a second $4^{th}$-order low pass filter configured to cut high frequency components having a frequency higher than a second predetermined cutoff frequency from an output signal of the second adder, and a third adder configured to add the input signal and an output signal of the second $4^{th}$-order low pass filter and output a resultant signal.

According to the present disclosure, it is possible to provide a pseudo bass generating apparatus to generate a high-quality pseudo bass with minimal or reduced noise.

DETAILED DESCRIPTION

Figure 1:
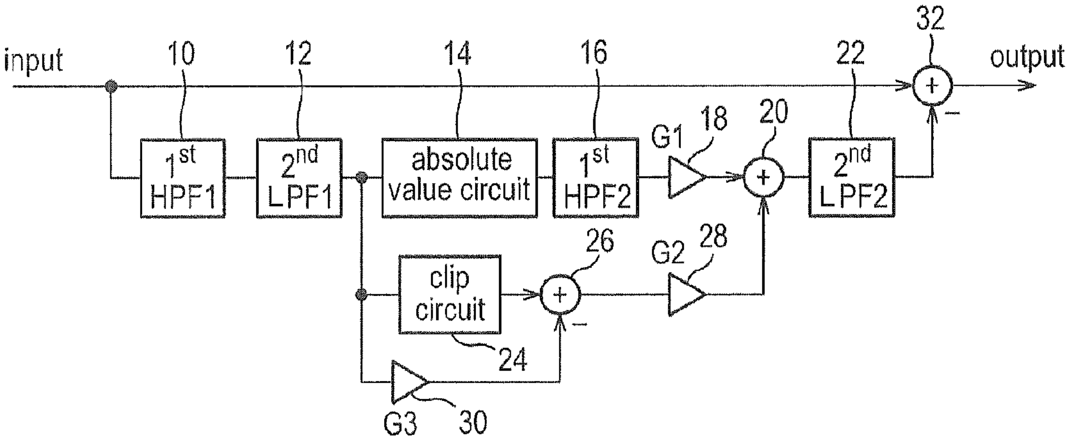
FIG. 1 is a block diagram illustrating a pseudo bass generating apparatus in accordance with a comparative example.

Various embodiments of the present disclosure will now be described with reference to the drawings. In the following description, identical or similar elements will be designated by identical or similar reference symbols. Furthermore, the drawings serve as representations of various embodiments, and it should be appreciated that dimensions or the like of each component may differ from the actual ones. Accordingly, specific dimensions should be determined in light of the following description. It goes without saying that certain portions included in the drawings differ in the relationship and ratio of dimensions from one another.

In addition, the embodiments described below illustrate an apparatus for embodying the spirit of the present disclosure, and the embodiments are not limited to the following material, shape, structure, arrangement or the like of each component. Modifications may be made within the accompanying claims.

Embodiment (Pseudo Bass Generating Apparatus According to a Comparative Example)

FIG. 1 is a block diagram illustrating a pseudo bass generating apparatus according to a comparative example, which performs a pseudo bass reproduction processing by receiving and processing a digital audio input signal (hereinafter simply referred to as "input signal"). An output signal of the pseudo bass generating apparatus is converted into an analog audio signal by a D/A converter (not shown) in the subsequent stage, and the analog audio signal is supplied to an electro-acoustic conversion element (not shown), such as a speaker, headphone, etc. The electro-acoustic conversion element lacks in a low-frequency reproduction capability. For example, the element is not able to reproduce low-frequency component signals lower than 50 Hz or 100 Hz. In this situation, the pseudo bass generating apparatus allows a user to perceive the low-frequency signals which cannot be actually generated (irreproducible) in the speaker, as if the low-frequency signals were being reproduced.

Figure 4:
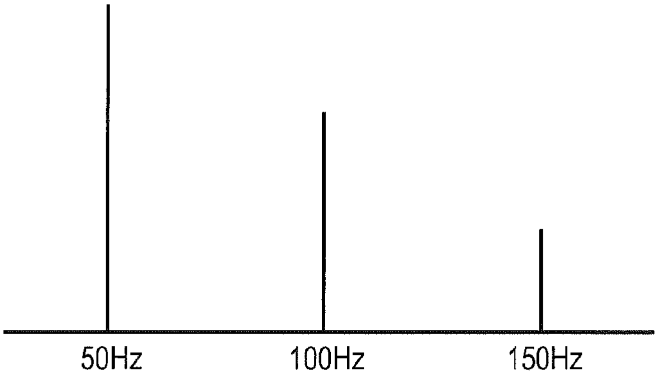
FIG. 4 is a signal diagram illustrating a mechanism to generate a pseudo bass in the pseudo bass generating apparatus according to the comparative example.

For example, as illustrated in FIG. 4, if signals of two frequencies whose greatest common divisor is 50 Hz (a 100 Hz signal as a $2^{nd}$-order harmonic and a 150 Hz signal as a $3^{rd}$-order harmonic) are input to a speaker that is unable to reproduce a band of 50 Hz or less, a listener perceives the output signal as if a 50 Hz sound was being reproduced.

Hereinafter, a configuration of the pseudo bass generating apparatus according to the comparative example will be described.

The pseudo bass generating apparatus according to the comparative example includes a $1^{st}$-order high pass filter (HPF1) 10, a $2^{nd}$-order low pass filter (LPF1) 12, an absolute value circuit 14, a clip circuit 24, a $1^{st}$-order high pass filter (HPF2) 16, a $2^{nd}$-order low pass filter (LPF2) 22, multipliers 18, 28, 30, and adders 20, 26, 32.

The $1^{st}$-order high pass filter (HPF1) 10 cuts out unnecessary low-frequency components of the input signal, i.e., low-frequency components having a frequency lower than a predetermined cutoff frequency. The $1^{st}$-order high pass filter (HPF1) 10 allows for signal processing to be performed efficiently in the subsequent circuit.

The $2^{nd}$-order low pass filter (LPF1) 12 cuts out unnecessary high-frequency components of the input signal, i.e., high-frequency components having a frequency higher than a predetermined cutoff frequency. The $2^{nd}$-order low pass filter (LPF1) 12 allows for signal processing to be performed efficiently in the subsequent circuit. Irreproducible low-frequency signals may be included in an output signal from the $2^{nd}$-order low pass filter (LPF1) 12. Here, the meaning of "cut" or "cut out" may refer to not only "completely remove," but also to "attenuate."

Figure 2A:
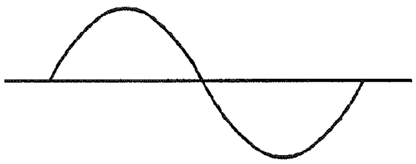
FIG. 2A is a signal diagram illustrating an operation waveform of an input signal of an absolute value circuit of the pseudo bass generating apparatus according to the comparative example.
Figure 2B:
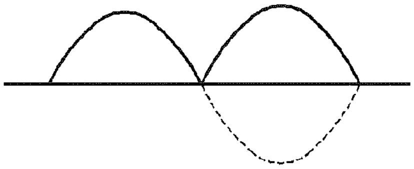
FIG. 2B is a signal diagram illustrating an operation waveform of an output signal from an absolute value circuit of the pseudo bass generating apparatus, according to the comparative example.

The absolute value circuit 14 determines an absolute value of the output signal from the $2^{nd}$-order low pass filer (LPF1) 12 to generate even harmonics. More specifically, as illustrated in FIGS. 2A and 2B, an output signal from the absolute value circuit 14 is mainly composed of the input signal and even harmonics including a $2^{nd}$-order harmonic of the input signal. The output signal from the $2^{nd}$-order low pass filer (LPF1) 12 is full-wave rectified by the absolute value circuit 14.

The $1^{st}$-order high pass filter (HPF2) 16 cuts a DC component of the output signal from the absolute value circuit 14. In other words, the $1^{st}$-order high pass filter (HPF2) 16 cancels an offset occurring behind the absolute value circuit 14. The multiplier 18 multiplies an output signal from the $1^{st}$-order high pass filter (HPF2) 16 with a predetermined coefficient (gain G1: addition gain of even harmonics).

Figure 3A:
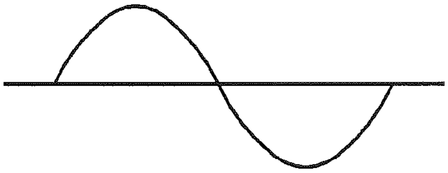
FIG. 3A is a signal diagram illustrating an operation waveform of an input signal of a clip circuit of the pseudo bass generating apparatus according to the comparative example.
Figure 3B:
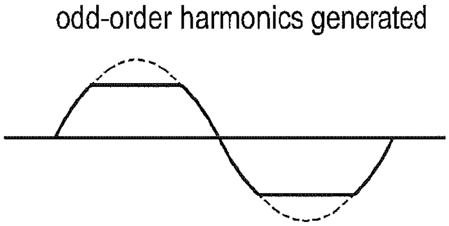
FIG. 3B is a signal diagram illustrating an operation waveform of an output signal of a clip circuit of a pseudo bass generating apparatus, according to the comparative example.

The clip circuit 24 clips the output signal from the $2^{nd}$-order low pass filter (LPF1) 12 with positive and negative limit values to generate odd harmonics. More specifically, as illustrated in FIGS. 3A and 3B, the output signal from the clip circuit 24 is mainly composed of the input signal and odd harmonics including a $3^{rd}$-order harmonic of the input signal.

The multiplier 30 multiplies the output signal from the $2^{nd}$-order low pass filter (LPF1) 12 with a predetermined coefficient (gain G3).

The adder 26 subtracts an output signal of the multiplier 30 from the output signal of the clip circuit 24 to reduce amplitude of an input frequency. The multiplier 28 multiplies an output signal from the adder 26 with a predetermined coefficient (gain G2: addition gain of odd harmonics). The adder 20 adds an output signal from the multiplier 18 and an output signal from the multiplier 28 and outputs a resultant signal.

The $2^{nd}$-order low pass filter (LPF2) 22 cuts unnecessary high-frequency components of the pseudo bass signal to suppress voice noise.

The adder 32 inverts an output from the $2^{nd}$-order low pass filter (LPF2) 22, and adds the inverted output and the original input signal. The pseudo bass generating apparatus outputs an output signal from the adder 32 to the subsequent circuit (not shown).

The pseudo bass generating apparatus according to the comparative example subtracts a signal obtained by multiplying the output signal from the $2^{nd}$-order low pass filter (LPF1) 12 with G3 from a signal behind the clip circuit 24 to remove irreproducible low-frequency components. Therefore, it is possible to suppress an overflow from occurring inside the pseudo bass generation apparatus and in the subsequent stage thereto. It is possible to suppress degradation of sound quality by reducing the overflow. The low-frequency components are not directly reproduced from a speaker or a headphone in the subsequent stage. Therefore, there is substantially no influence on hearing, even though the irreproducible low-frequency components are removed.

On the other hand, since the $2^{nd}$-order low pass filter (LPF1) 12 and the $2^{nd}$-order low pass filter (LPF2) 22 for cutting the high-frequency components are $2^{nd}$-order low pass filters in the pseudo bass generating apparatus according to the comparative example, a cutoff characteristic of the apparatus is not so sharp. Therefore, for example, if the cutoff frequencies of the $2^{nd}$-order low pass filter (LPF1) 12 and the $2^{nd}$-order low pass filter (LPF2) 22 are increased in order to correspond to a speaker whose lower limit of a reproduction frequency is even lower, a noise is included in the resultant sound output. Therefore, it is difficult to generate a high-quality pseudo bass.

(Pseudo Bass Generating Apparatus According to an Embodiment of the Present Disclosure)

Figure 5:
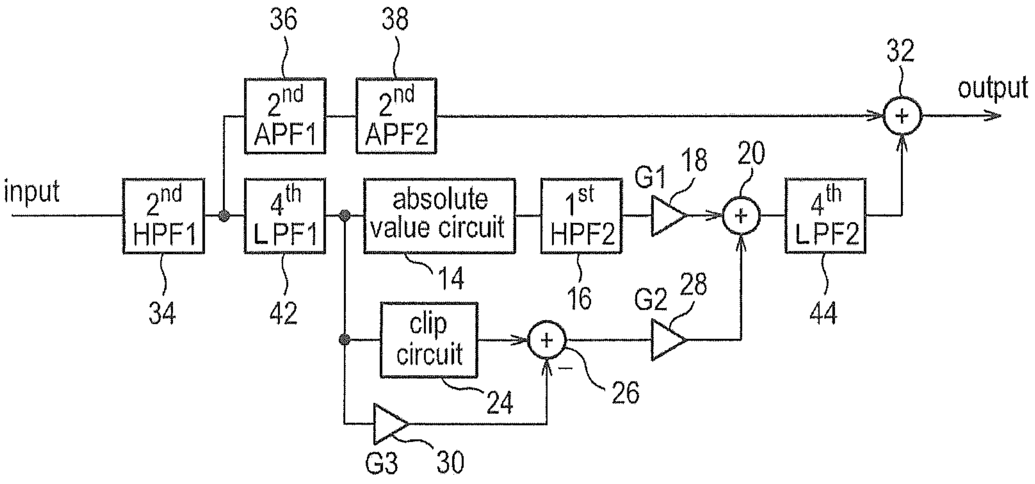
FIG. 5 is a block diagram illustrating a pseudo bass generating apparatus according to some embodiments.

FIG. 5 is a block diagram illustrating a pseudo bass generating apparatus according some embodiments.

The pseudo bass generating apparatus of FIG. 5 differs from the apparatus according to the comparative example in that the $1^{st}$-order high pass filter (HPF1) 10 is replaced with the $2^{nd}$-order high pass filter (HPF1) 34, the $2^{nd}$-order low pass filter (LPF1) 12 is replaced with the $4^{th}$-order low pass filter (LPF1) 42, and the $2^{nd}$-order low pass filter (LPF2) 22 is replaced with the $4^{th}$-order low pass filter (LPF2) 44. Even though a higher cutoff frequency is used, noise in the output sound is not heard with the use of low pass filters having a higher order. In addition, the pseudo bass generating apparatus differs from the apparatus according to the comparative example of FIG. 1 in that a $2^{nd}$-order all pass filter (APF1) 36 and a $2^{nd}$-order all pass filter (APF2) 38 are included in the circuit of FIG. 5 for phase compensation.

The pseudo bass generating apparatus of FIG. 5 performs pseudo bass reproduction processing by receiving and processing a digital audio input signal (hereinafter simply referred to as "input signal"). The output signal of the pseudo bass generating apparatus is converted into an analog audio signal by a D/A converter (not shown) in a subsequent stage, and the analog audio signal is supplied to an electro-acoustic conversion element (not shown), such as a speaker, headphone, etc. The electro-acoustic conversion element lacks in a low-frequency reproduction capability, and is not able to reproduce low-frequency component signals lower than 50 Hz or 100 Hz, for example. In this situation, the pseudo bass generating apparatus allows a user to perceive the low-frequency signals irreproducible from a speaker, as if the low-frequency signals were being reproduced.

For example, as illustrated in FIG. 4, if signals of two frequencies whose greatest common divisor is 50 Hz (a 100 Hz signal as a $2^{nd}$-order harmonic and a 150 Hz signal as a $3^{rd}$-order harmonic) are input to a speaker which is unable to reproduce a band of 50 Hz or less, a listener perceives the output signal as if a 50 Hz sound was being reproduced.

The pseudo bass generating apparatus of FIG. 5 includes a $2^{nd}$-order high pass filter (HPF1) 34, a $4^{th}$-order low pass filter (LPF1) 42, an absolute value circuit 14, a clip circuit 24, a $1^{st}$-order high pass filter (HPF2) 16, a $4^{th}$-order low pass filter (LPF2) 44, multipliers 18, 28, 30, adders 20, 26, 32, a $2^{nd}$-order all pass filter (APF1) 36, and a $2^{nd}$-order all pass filter (APF2) 38.

The second high pass filter (HPF1) 34 cuts out unnecessary low-frequency component input signals. Signal processing can be performed efficiently in the subsequent circuit by providing the $2^{nd}$-order high pass filter (HPF1) 34.

The $4^{th}$-order low pass filter (LPF1) 42 cuts out unnecessary high-frequency component input signals. The irreproducible low-frequency signals are extracted by the $4^{th}$-order low pass filter (LPF1) 42. Signal processing can be performed efficiently in the subsequent circuit by providing the $4^{th}$-order low pass filter (LPF1) 42. Here, the $4^{th}$-order low pass filter (LPF1) 42 uses a cutoff frequency higher than that used for the $2^{nd}$-order low pass filter (LPF1) 12. Here, the meaning of "cut" or "cut out" refers to not only "completely remove," but also to "attenuate."

The absolute value circuit 14 takes an absolute value of an output signal from the $4^{th}$-order low pass filer (LPF1) 42 to generate even harmonics. More specifically, as illustrated in FIG. 2B, an output signal from the absolute value circuit 14 is mainly composed of the input signal and even harmonics including a $2^{nd}$-order harmonic of the input signal. The output signal from the $4^{th}$-order low pass filer (LPF1) 42 is full-wave rectified by the absolute value circuit 14.

The $1^{st}$-order high pass filter (HPF2) 16 cuts out a DC component of the output signal from the absolute value circuit 14. The $1^{st}$-order high pass filter (HPF2) 16 cancels an offset occurring behind the absolute value circuit 14. The multiplier 18 multiplies an output signal of the $1^{st}$-order high pass filter (HPF2) 16 with a predetermined coefficient (gain G1: addition gain of even harmonics).

The clip circuit 24 clips the output signal of the $4^{th}$-order low pass filter (LPF1) 42 with each of positive and negative limit values to generate odd harmonics. More specifically, as illustrated in FIG. 3B, an output signal from the clip circuit 24 is mainly composed of the input signal and odd harmonics including a third-order harmonic of the input signal.

The multiplier 30 multiplies the output signal from the $4^{th}$-order low pass filter (LPF1) 42 with a predetermined coefficient (gain G3).

The adder 26 subtracts an output signal of the multiplier 30 from the output signal of the clip circuit 24 to reduce an amplitude of an input frequency. The multiplier 28 multiplies an output signal from the adder 26 with a predetermined coefficient (gain G2: addition gain of odd harmonics). The adder 20 adds an output signal from the multiplier 18 and an output signal from the multiplier 28 and outputs a resultant signal.

The $4^{th}$-order low pass filter (LPF2) 44 receives an output signal (pseudo bass signal) from the adder 20 and cuts unnecessary high-frequency components to suppress noise in the output sound. The $4^{th}$-order low pass filter (LPF2) 44 uses a cutoff frequency higher than that used for the $2^{nd}$-order low pass filter (LPF2) 22 of the comparative example.

The $2^{nd}$-order all pass filter (APF1) 36 is used as a filter for phase compensation and it receives an output signal from the $2^{nd}$-order high pass filter (HPF1) 34 and changes only a frequency-phase characteristic without changing a frequency-amplitude characteristic. A cutoff frequency of the $2^{nd}$-order all pass filter (APF1) 36 is set as the same value as the cutoff frequency of the $4^{th}$-order low pass filter (LPF1) 42.

The $2^{nd}$-order all pass filter (APF2) 38 is used as a filter for phase compensation and it receives an output signal from the $2^{nd}$-order all pass filter (APF1) 36 and changes only a frequency-phase characteristic without changing a frequency-amplitude characteristic. A cutoff frequency of the $2^{nd}$-order all pass filter (APF2) 38 is set as the same value as the cutoff frequency of the $4^{th}$-order low pass filter (LPF2) 44.

The adder 32 adds an output signal from the $4^{th}$-order low pass filter (LPF2) 44 and an output signal from the $2^{nd}$-order all pass filter (APF2) 38. By using the $2^{nd}$-order all pass filter (APF1) 36 and the $2^{nd}$-order all pass filter (APF2) 38 as the filter for phase compensation, the signals added in the adder 32 is prevented from being destructively matched with each other.

The pseudo bass generating apparatus outputs an output signal from the adder 32 to a subsequent circuit (not shown).

The pseudo bass generating apparatus according to the embodiment subtracts a signal obtained by multiplying the output signal from the $4^{th}$-order low pass filter (LPF1) 42 with G3 from the signal behind the clip circuit 24 to remove irreproducible low-frequency components, thus being able to reduce an amplitude of an effective signal. Therefore, it is possible to suppress an overflow from occurring inside the pseudo bass generating apparatus and in the subsequent stage thereto. Further, it is possible to suppress degradation of sound quality by reducing the overflow. Even though the irreproducible low-frequency components are removed, there is substantially no influence on resultant sound being heard because the irreproducible low-frequency components are not directly reproduced from a speaker or a headphone in the subsequent stage.

Further, in the pseudo bass generating apparatus according FIG. 5, the $2^{nd}$-order low pass filter (LPF1) 12 and the $2^{nd}$-order low pass filter (LPF2) 22 used in the comparative example are replaced with a $4^{th}$-order low pass filter (LPF1) 42 and a $4^{th}$-order low pass filter (LPF2) 44, respectively. Therefore, for example, even though the cutoff frequencies of the $4^{th}$-order low pass filter (LPF1) 42 and the $4^{th}$-order low pass filter (LPF2) 44 are increased in order to correspond to a speaker whose lower limit of a reproduction frequency is even lower, it is possible to generate a high-quality pseudo bass with minimal or reduced noise in the resulting output sound.

Figure 7A:
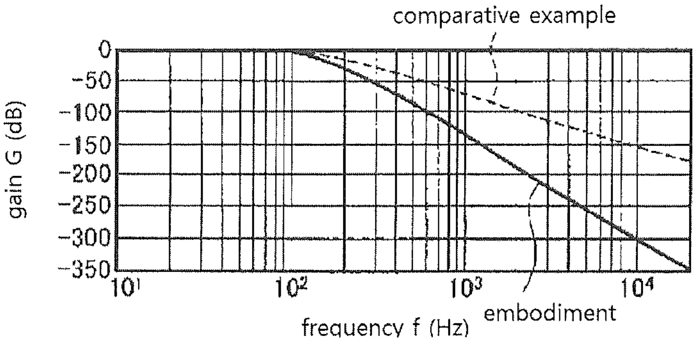
FIGS. 7A and 7B are signal diagrams illustrating an effect of increasing an order of a low pass filter in the pseudo bass generating apparatus according to some embodiments.
Figure 7B:
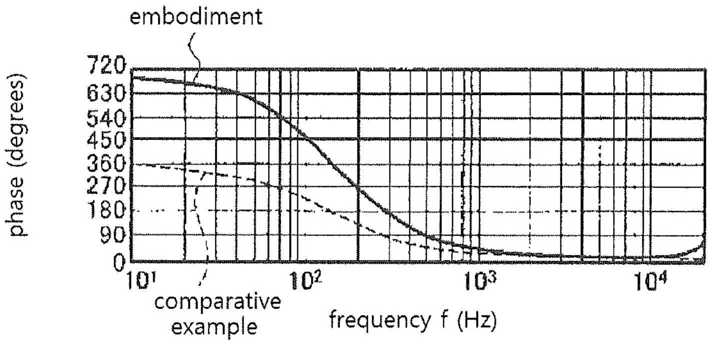

FIGS. 7A and 7B are diagrams illustrating an effect of increasing the order of the low pass filter in the pseudo bass generating apparatus according to the embodiment. FIGS. 7A and 7B compare the effect of characteristics (e.g., frequency versus gain in dB and phase in degrees, respectively) of the configuration shown in FIG. 1 of the comparative example to the pseudo bass generating configuration of FIG. 5. It can be seen from FIGS. 7A and 7B that the attenuation of mid-high frequency is greater when the $4^{th}$-order low pass filter (LPF1) 42 and the $4^{th}$-order low pass filter (LPF2) 44 are used (as in the embodiment of FIG. 5) than when the $2^{nd}$-order low pass filter (LPF1) 12 and the $2^{nd}$-order low pass filter (LPF2) 22 are used (as in the comparative example). Therefore, the pseudo bass generating apparatus of FIG. 5 can be enabled to suppress unnecessary mid-high frequency components more effectively than the pseudo bass generating apparatus of the comparative example.

Figure 6A:
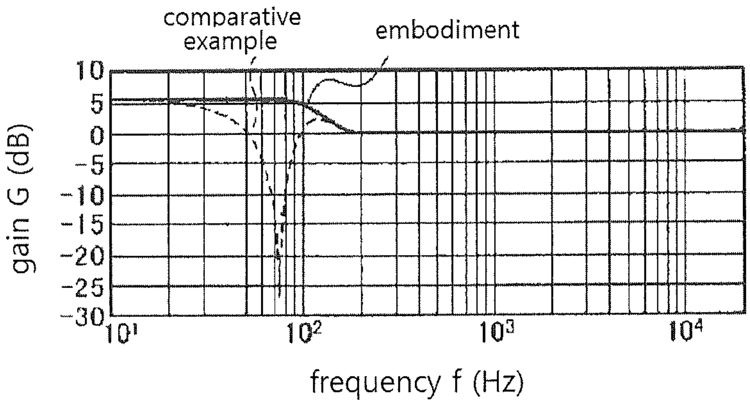
FIGS. 6A and 6B are signal diagrams illustrating an effect of phase compensation in the pseudo bass generating apparatus according to some embodiments.
Figure 6B:
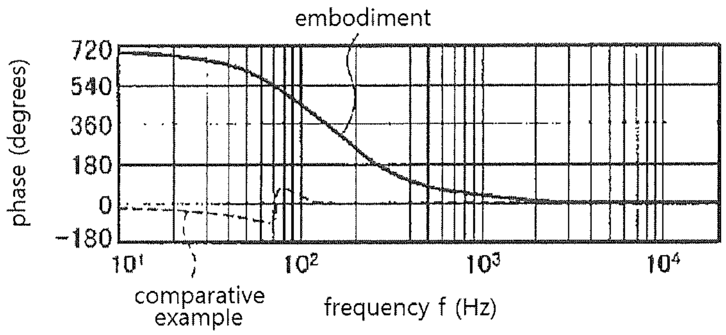

In addition, the pseudo bass generating apparatus of FIG. 5 includes the $2^{nd}$-order all pass filter (APF1) 36 and the $2^{nd}$-order all pass filter (APF2) 38 as a filter for phase compensation. FIGS. 6A and 6B are diagrams illustrating an effect of phase compensation in the pseudo bass generating apparatus of FIG. 5. In FIGS. 6A and 6B, a characteristic (e.g., frequency versus gain in dB or phase in degrees, respectively) of the configuration in FIG. 5 is shown as an example and corresponding characteristics of the configuration in FIG. 5 except for the $2^{nd}$-order all pass filter (APF1) 36 and the $2^{nd}$-order all pass filter (APF2) 38 is shown as the comparative example. As clearly seen from FIGS. 6A and 6B, a decline in frequency characteristic is observed when the phase compensation is not performed (as in the comparative example) so that an effect of bass enhancement become weaken, but the decline in frequency characteristic is not observed when the phase compensation is performed (as in the apparatus of FIG. 5) so that the effect of bass enhancement becomes remarkable.

In this manner, it is possible to configure a pseudo bass generating apparatus to generate a high-quality pseudo bass with minimal or reduced noise.

Other Embodiments

One or more embodiments or variations of an embodiment of the present disclosure have been described as above, but the description and the drawings of the present disclosure should not be understood as limiting the present disclosure. It will be apparent to those skilled in the art that various alternative embodiments, examples and operational techniques may be practiced.

Thus, it goes without saying that the present disclosure includes various embodiments not described here. Therefore, the scope of the present disclosure is to be defined only by the disclosure specific matters pertaining to the claims which are reasonable in view of the above description.

The pseudo bass generating apparatus according to the present disclosure is broadly applicable to an apparatus for producing sounds, such as a TV, radio, radio-cassette player, car audio, home theater system, audio component, mobile phone, electronic musical instrument, and, in particular, to a small or flat audio set or TV set incapable of fully reproducing the bass.

While certain embodiments have been described, these embodiments have been presented by way of example only, and are not intended to limit the scope of the disclosures. Indeed, the novel devices described herein may be embodied in a variety of other forms; furthermore, various omissions, substitutions, combinations and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pseudo bass generating apparatus, comprising:

a first $4^{th}$-order low pass filter configured to cut out high-frequency components having a frequency higher than a first predetermined cutoff frequency from an input signal;

an absolute value circuit configured to output an absolute value of an output signal of the first $4^{th}$-order low pass filter;

a clip circuit configured to clip the output signal of the first $4^{th}$-order low pass filter with predetermined positive and negative limit values;

a multiplier configured to multiply the output signal of the first $4^{th}$-order low pass filter with a predetermined coefficient;

a first adder configured to subtract an output signal of the multiplier from an output signal of the clip circuit;

a second adder configured to add an output signal of the first adder and an output signal of the absolute value circuit;

a second $4^{th}$-order low pass filter configured to cut out high-frequency components having a frequency higher than a second predetermined cutoff frequency from an output signal of the second adder; and a third adder configured to add the input signal and an output signal of the second $4^{th}$-order low pass filter.

2. The apparatus of claim 1, wherein the output signal of the absolute value circuit is includes the input signal and even harmonics including a second-order harmonic of the input signal, and the output signal of the clip circuit includes the input signal and odd harmonics including a third-order harmonics of the input signal.

3. The apparatus of claim 1, further comprising a high pass filter configured to cut out low-frequency components having a frequency lower than a third predetermined cutoff frequency.

4. The apparatus of claim 1, further comprising a high pass filter configured to remove a DC component from the output signal of the absolute value circuit.

5. The apparatus of claim 1, further comprising:

a first $2^{nd}$-order all pass filter configured to receive the input signal and change only a frequency-phase characteristic without changing a frequency-amplitude characteristic of the input signal; and a second $2^{nd}$-order all pass filter configured to receive an output signal from the first $2^{nd}$-order all pass filter and change only a frequency-phase characteristic without changing a frequency-amplitude characteristic of the output signal from the first $2^{nd}$-order all pass filter, and wherein the third adder is configured to add an output signal from the second $2^{nd}$-order all pass filter and the output signal from the second $4^{th}$-order low pass filter.

6. The apparatus of claim 2, further comprising:

a first $2^{nd}$-order all pass filter configured to receive the input signal and change only a frequency-phase characteristic without changing a frequency-amplitude characteristic of the input signal; and a second $2^{nd}$-order all pass filter configured to receive an output signal from the first $2^{nd}$-order all pass filter and change only a frequency-phase characteristic without changing a frequency-amplitude characteristic of the output signal from the first $2^{nd}$-order all pass filter, and wherein the third adder is configured to add an output signal from the second $2^{nd}$-order all pass filter and the output signal of the second $4^{th}$-order low pass filter.

7. The apparatus of claim 3, further comprising:

a first $2^{nd}$-order all pass filter configured to receive the input signal and change only a frequency-phase characteristic without changing a frequency-amplitude characteristic of the input signal; and a second $2^{nd}$-order all pass filter configured to receive an output signal from the first $2^{nd}$-order all pass filter and change only a frequency-phase characteristic without changing a frequency-amplitude characteristic of the output signal from the first $2^{nd}$-order all pass filter, and wherein the third adder is configured to add an output signal from the second $2^{nd}$-order all pass filter and the output signal of the second $4^{th}$-order low pass filter.

8. The apparatus of claim 4, further comprising:

a first $2^{nd}$-order all pass filter configured to receive the input signal and change only a frequency-phase characteristic without changing a frequency-amplitude characteristic of the input signal; and a second $2^{nd}$-order all pass filter configured to receive an output signal from the first $2^{nd}$-order all pass filter and change only a frequency-phase characteristic without changing a frequency-amplitude characteristic of the output signal from the first $2^{nd}$-order all pass filter, and wherein the third adder is configured to add an output signal from the second $2^{nd}$-order all pass filter and the output signal of the second $4^{th}$-order low pass filter.

9. The apparatus of claim 5, wherein a cutoff frequency of the first $2^{nd}$-order all pass filter is set as the same value as that of the first $4^{th}$-order low pass filter, and a cutoff frequency of the second $2^{nd}$-order all pass filter is set at the same value as that of the second $4^{th}$-order low pass filter.

10. The apparatus of claim 6, wherein a cutoff frequency of the first $2^{nd}$-order all pass filter is set as the same value as that of the first $4^{th}$-order low pass filter, and a cutoff frequency of the second $2^{nd}$-order all pass filter is set at the same value as that of the second $4^{th}$-order low pass filter.

11. The apparatus of claim 7, wherein a cutoff frequency of the first $2^{nd}$-order all pass filter is set as the same value as that of the first $4^{th}$-order low pass filter, and a cutoff frequency of the second $2^{nd}$-order all pass filter is set at the same value as that of the second $4^{th}$-order low pass filter.

12. The apparatus of claim 8, wherein a cutoff frequency of the first $2^{nd}$-order all pass filter is set as the same value as that of the first $4^{th}$-order low pass filter, and a cutoff frequency of the second $2^{nd}$-order all pass filter is set at the same value as that of the second $4^{th}$-order low pass filter.

* * * * *